United States Patent
Tsai et al.

(10) Patent No.: US 7,521,860 B2
(45) Date of Patent: Apr. 21, 2009

(54) ORGANIC ELECTRO-LUMINESCENCE DISPLAY WITH MULTIPLE PROTECTIVE FILMS

(75) Inventors: Ya-Ping Tsai, Nantou County (TW); Yi-Lung Kao, Taoyuan County (TW); Chih-Kwang Tzen, Pingtung County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 522 days.

(21) Appl. No.: 11/162,084

(22) Filed: Aug. 29, 2005

(65) Prior Publication Data

US 2007/0046187 A1 Mar. 1, 2007

(51) Int. Cl.
*H01J 1/62* (2006.01)
*H01J 63/04* (2006.01)

(52) U.S. Cl. .............. 313/506; 313/498; 313/504; 313/512; 313/112

(58) Field of Classification Search ............ 313/498, 313/501, 504, 506, 512, 112, 113
See application file for complete search history.

(56) References Cited

U.S. PATENT DOCUMENTS

| | | | |
|---|---|---|---|
| 4,346,324 A * | 8/1982 | Yoldas | 313/112 |
| 4,931,315 A | 6/1990 | Mellor | 427/167 |
| 5,076,675 A * | 12/1991 | Kusaka et al. | 359/484 |
| 5,869,929 A * | 2/1999 | Eida et al. | 313/501 |
| 6,046,543 A * | 4/2000 | Bulovic et al. | 313/504 |
| 2003/0085652 A1* | 5/2003 | Weaver | 313/506 |
| 2004/0166362 A1* | 8/2004 | Utsumi et al. | 428/690 |
| 2006/0138945 A1* | 6/2006 | Wolk et al. | 313/506 |
| 2007/0001588 A1* | 1/2007 | Boroson et al. | 313/504 |
| 2007/0003743 A1* | 1/2007 | Asano et al. | 428/201 |

FOREIGN PATENT DOCUMENTS

| | | |
|---|---|---|
| CN | 1477907 | 2/2004 |
| JP | 61-077017 | 4/1986 |
| JP | 2002-502104 | 1/2002 |
| JP | 2005-100939 | 4/2005 |

* cited by examiner

*Primary Examiner*—Joseph L Williams
*Assistant Examiner*—Kevin Quarterman
(74) *Attorney, Agent, or Firm*—Jianq Chyun IP Office (57) ABSTRACT

An organic electro-luminescence display including a substrate, a plurality of white light electro-luminescence devices, a first protecting film, a second protecting film and a third protecting film is provided. The white light electro-luminescence devices are disposed on the substrate. The first protecting film covers a portion of the white light electro-luminescence devices and has a property of filtering first-color light. The second protecting film covers another portion of the white light electro-luminescence devices and has a property of filtering second-color light. The third protecting film covers other portion of the white light electro-luminescence devices and has a property of filtering third-color light.

16 Claims, 7 Drawing Sheets

FIG. 6C

ORGANIC ELECTRO-LUMINESCENCE DISPLAY WITH MULTIPLE PROTECTIVE FILMS

BACKGROUND OF THE INVENTION

1. Field of the Invention

The present invention generally relates to an organic electro-luminescence display. More particularly, the present invention relates to an organic electro-luminescence display including protecting films having functions of filtering color and resisting moisture and oxygen.

2. Description of Related Art

Flat panel display devices have proceeded quite rapidly. In particular, organic electro-luminescence displays have the advantages of no viewing angle restriction, low production cost, high response speed, low power consumption, wide operating temperature range, lightness and small volume occupancy. Accordingly, the organic electro-luminescence display has potential applications and can become the main trend for the next generation displays.

The organic electro-luminescence display is composed of a plurality of organic electro-luminescence devices, each device includes a pair of electrode and an organic functional layer. The organic electro-luminescence device performs display via recombination holes with electrons within the organic functional layer for generating excitons. Hence, color of the emitted light is in accordance with the composition of the organic functional layer.

Figure 1A:
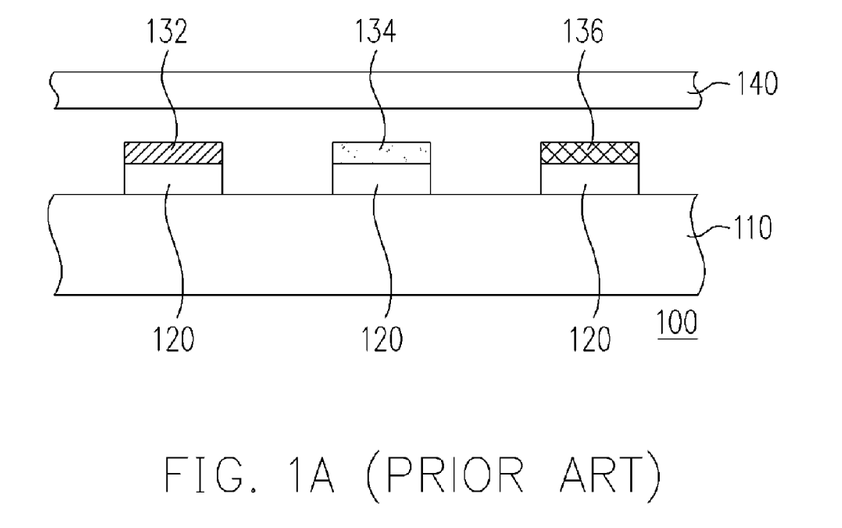
FIG. 1A and FIG. 1B are cross-section views showing two conventional organic electro-luminescence displays.
Figure 1B:
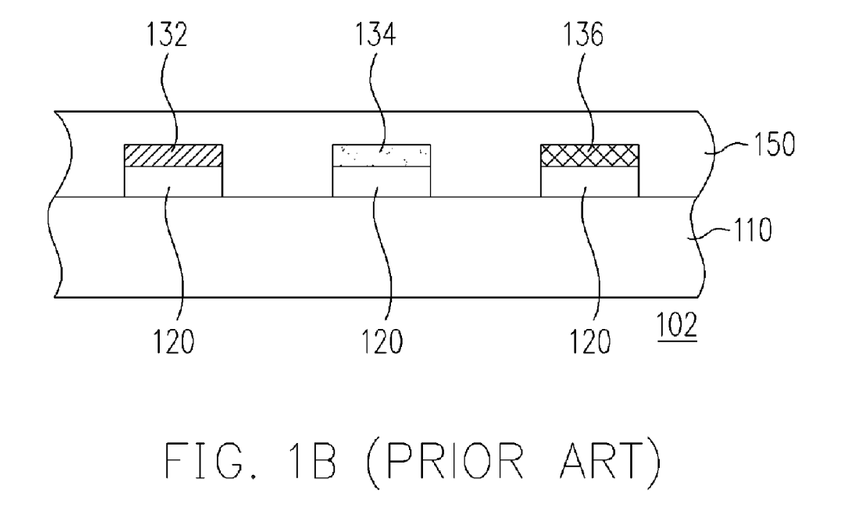

FIG. 1A and FIG. 1B are cross-section views showing two conventional organic electro-luminescence displays. As shown in FIG. 1A, the conventional organic electro-luminescence display 100 includes a substrate 110, white light organic electro-luminescence devices 120, color filters 132, 134, 136 and a covering cap 140.

The white light organic electro-luminescence devices 120 are disposed on the substrate 100, and the color filters 132, 134, 136 are disposed over the white light organic electro-luminescence devices 120 for full-color displaying. In addition, the covering cap 140 is disposed over the substrate 110 to insulate the white light organic electro-luminescence devices 120 of the organic electro-luminescence display 100 from moisture and oxygen.

As shown in FIG. 1B, in another organic electro-luminescence display 102, a protecting layer 150 is used instead of the covering cap 140 of FIG. 1A to insulate the white light organic electro-luminescence devices 120 of the organic electro-luminescence display 102 from moisture and oxygen. Also, both the protecting layer 150 and the covering cap 140 can also be used to protect the white light organic electro-luminescence devices in another conventional method.

However, when light filtered by the color filters 132, 134, 136 passes through the covering cap 140 or/and the protecting layer 150, the light does not have optimum brightness. This is because the transmittance of light having different color is not the same or similar when the light passing through the cover cap 140 or/and the protecting layer 150 so that the display quality of the organic electro-luminescence display is limited.

SUMMARY OF THE INVENTION

Accordingly, the present invention is directed to an organic electro-luminescence display including protecting films having functions of filtering color and resisting moisture and oxygen, and light passing through each protecting film has optimum brightness.

According to an embodiment of the present invention, an organic electro-luminescence display including a substrate, a plurality of white light electro-luminescence devices, a first protecting film, a second protecting film and a third protecting film is provided. The white light electro-luminescence devices are disposed on the substrate. The first protecting film covers a portion of the white light electro-luminescence devices and has a property of filtering first-color light. The second protecting film covers another portion of the white light electro-luminescence devices and has a property of filtering second-color light. The third protecting film covers other portion of the white light electro-luminescence devices and has a property of filtering third-color light.

According to an embodiment of the present invention, the first-color light is red light, the second-color light is green light and the third-color light is blue light.

According to an embodiment of the present invention, the first protecting film is thicker than the second protecting film, and the second protecting film is thicker than the third protecting film. The first, second and third protecting films are respectively constituted of at least one stacked layer, and the stacked layer includes a first dielectric layer over the white light electro-luminescence devices, a second dielectric layer over the first dielectric layer, and a metal layer between the first and second dielectric layers.

According to an embodiment of the present invention, the metal layer has a material of silver.

According to an embodiment of the present invention, the first dielectric layer is constituted of at least one high refractive dielectric layer and at least one low refractive dielectric layer. The high refractive dielectric layer comprises silicon nitride or titanium dioxide. The low refractive dielectric layer comprises silicon oxide.

According to an embodiment of the present invention, the second dielectric layer is constituted of at least one high refractive dielectric layer and at least one low refractive dielectric layer. The high refractive dielectric layer comprises silicon nitride or titanium dioxide. The low refractive dielectric layer comprises silicon oxide.

According to an embodiment of the present invention, the first protecting film is constituted of at least one first stacked layer, and the first stacked layer comprises the following films sequentially stacked: a dielectric layer over the white light electro-luminescence devices, a first metal layer on the dielectric layer, a low refractive dielectric layer on the first metal layer, a second metal layer on the low refractive dielectric layer, and a high refractive dielectric layer on the second metal layer. The second and third protecting films are respectively constituted of at least one second stacked layer, each second stacked layer includes the following films sequentially stacked: a first low refractive dielectric layer over the white light electro-luminescence devices, a third metal layer on the first low refractive dielectric layer, a second low refractive dielectric layer on the third metal layer, a fourth metal layer on the second low refractive dielectric layer and a third low refractive dielectric layer on the fourth metal layer, wherein the second protecting film is thicker than the third protecting film.

According to an embodiment of the present invention, the first, second, third and fourth metal layers have a material of silver.

According to an embodiment of the present invention, the dielectric layer is constituted of at least one high refractive dielectric layer and at least one low refractive dielectric layer. The high refractive dielectric layer comprises titanium dioxide. The low refractive dielectric layer comprises silicon oxide.

According to an embodiment of the present invention, the low refractive dielectric layer, the first, second and third low refractive dielectric layers have a material of silicon oxide.

Accordingly, the protecting films having functions of filtering color and resisting moisture and oxygen so that the protecting films can replace both the color filters and the covering cap (or protecting layer) used in the prior art. In addition, light passing through each protecting film has optimum brightness.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
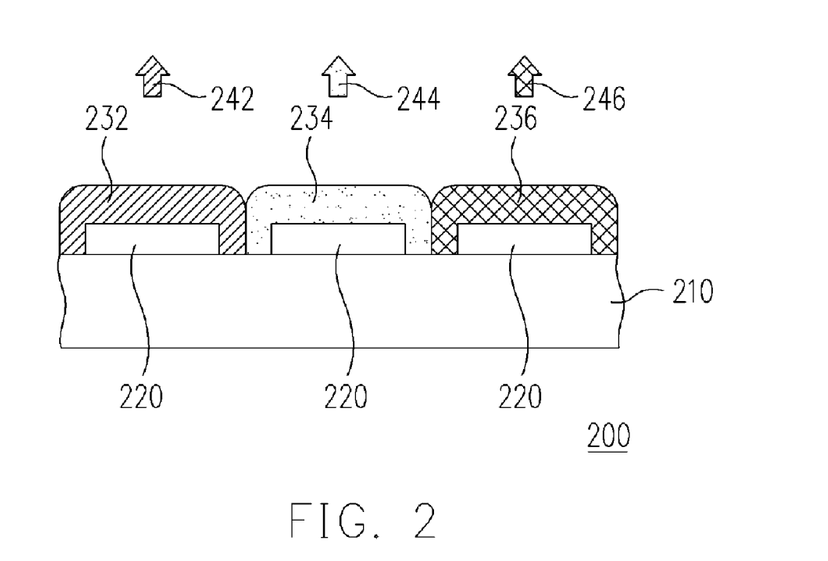
FIG. 2 is a cross-section view showing an organic electro-luminescence display according to an embodiment of the present invention.

FIG. 2 is a cross-section view showing an organic electro-luminescence display according to an embodiment of the present invention. As shown in FIG. 2, the organic electro-luminescence display 200 comprises a substrate 210, a plurality of white light organic electro-luminescence devices 220 and protecting films 232, 234 and 236.

The white light organic electro-luminescence devices 220 are disposed on the substrate 210. The white light organic electro-luminescence devices 220 are, for example, active matrix organic electro-luminescence devices or passive matrix organic electro-luminescence devices. Each active matrix organic electro-luminescence device comprises an active device, a pixel electrode (anode layer), an organic emitting layer and a cathode layer, for example. Each passive matrix organic electro-luminescence device comprises an anode layer, an organic emitting layer and a cathode layer, for example.

According to an embodiment of the present invention, if the organic emitting layer of the white light organic electro-luminescence device 220 is formed by inkjet printing process, a pixel defining layer (not shown) is further formed over the substrate 210 to define a plurality of pixel regions before forming the organic emitting layer, and then the organic emitting material ink is injected into each pixel region. In another embodiment, a plurality of separating strips is further formed before depositing the cathode layer so that the patterns of the cathode layer can be separated when depositing the cathode material.

As shown in FIG. 2, the protecting film 232 covers a portion of the white light organic electro-luminescence devices 220, and the protecting film 232 has a property of filtering first-color light 242. The first-color light 242 is red light, for example. The protecting film 234 covers another portion of the white light organic electro-luminescence devices 220, and the protecting film 234 has a property of filtering second-color light 244. The second-color light 244 is green light, for example. The protecting film 236 covers the other white light organic electro-luminescence devices 220, and the protecting film 236 has a property of filtering third-color light 246. The third-color light 246 is blue light, for example.

In an embodiment, when fabricating the protecting films 232, 234, 236, the thickness and composition thereof can be modified so that light passing through the protecting films 232, 234, 236 has optimum transmittance so that the light 242, 234, 236 transmitting out of the protecting films 232, 234, 236 has optimum brightness. In another embodiment, light with other colors except red light, green light and blue light can also be filtered by modifying the thickness and/or composition of the protecting film.

Figure 3:
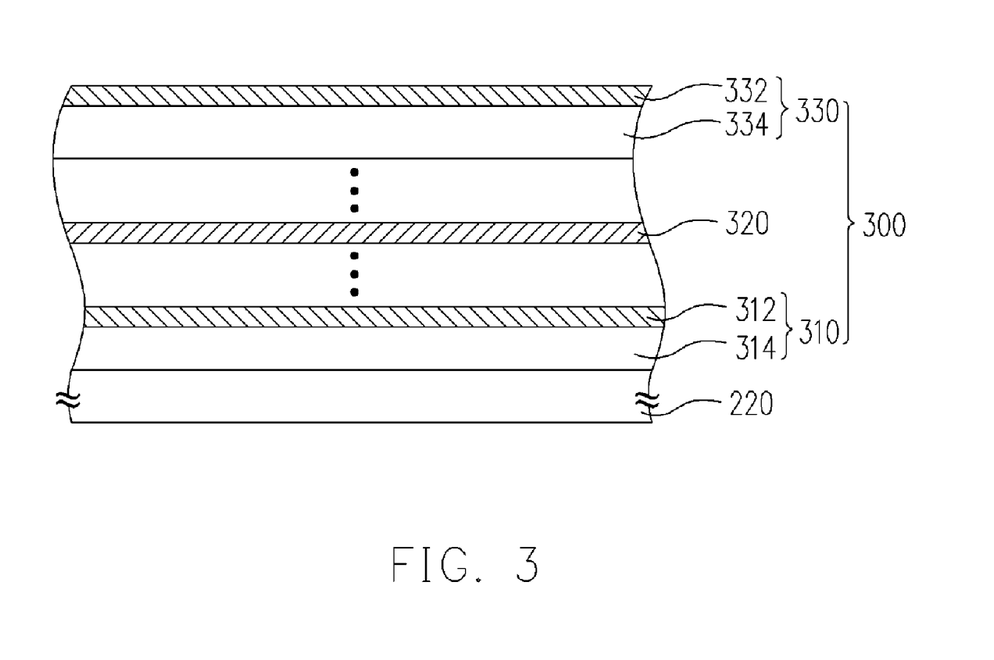
FIG. 3 is a cross-section view showing the protecting film of the organic electro-luminescence display according to an embodiment of the present invention.

The protecting films 232, 234, 236 of FIG. 2 are constituted of at least one stacked layer 300, as shown in FIG. 3. The stacked layer 300 comprises a dielectric later 310 over the white light electro-luminescence devices 220, another dielectric layer 330 over the dielectric later 310 and a metal layer 320 between the two dielectric layers 310, 330.

In an embodiment of the present invention, the metal layer 320 has a material of silver, and the dielectric layer 310 comprises at least one high reflective dielectric layer 312 and a low reflective dielectric layer 314. The high reflective dielectric layer 312 comprises silicon nitride or titanium dioxide, for example. The low reflective dielectric layer 314 comprises silicon oxide, for example.

Similarly, the dielectric layer 330 comprises at least one high reflective dielectric layer 332 and at least one low reflective dielectric layer 334. The high reflective dielectric layer 332 comprises silicon nitride or titanium dioxide, for example. The low reflective dielectric layer 334 comprises silicon oxide, for example.

In particular, the stacked layer 300 of each protecting film 232, 234, 236 has different thickness so the white light can be filtered as different color. For example, if the protecting film 232 is thicker than the protecting film 234, and the second protecting film 234 is thicker than the protecting film 236, the protecting film 232 is used for filtering red light, the protecting film 234 is used for filtering green light and the protecting film 236 is used for filtering blue light.

In details, the protecting films 232, 234, 236 are constituted of the stacked layer 300 having a metal layer 320 therein. When white light emits into the stacked layer 300 of the protecting film 232, white light may reflect and refract inside the stacked layer 300, and then light having wavelength in a predetermined range (red light, for example) may transmit out of the protecting film 232. Similarly, when white light emits into the protecting film 234, green light may transmit out of the protecting film 234. When white light emits into the protecting film 236, blue light may transmit out the protecting film 236.

Figure 4A:
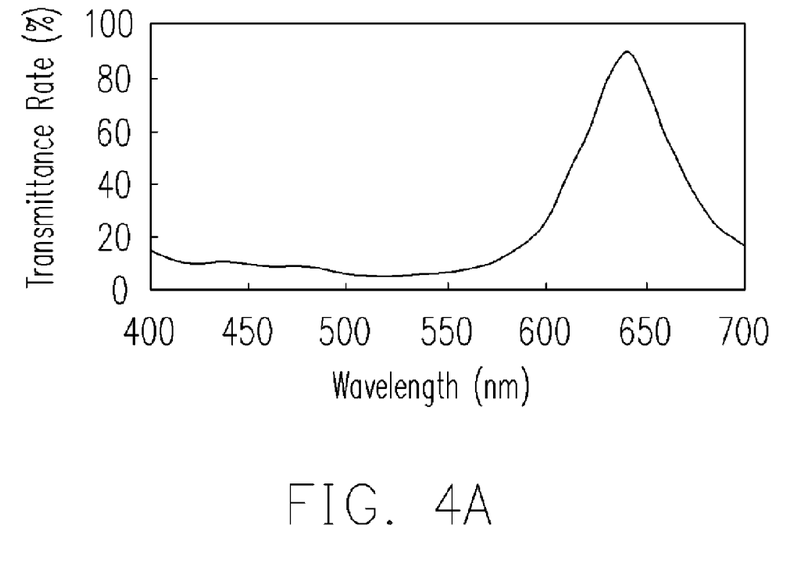
FIGS. 4A~4C are diagrams showing relationships of transmittance and wavelength when white light emits into three protecting films.
Figure 4B:
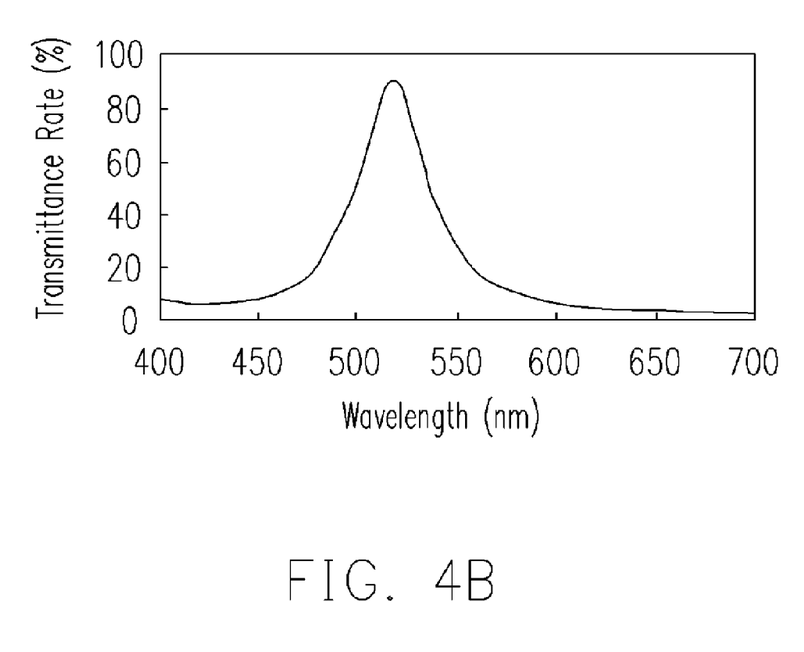
Figure 4C:
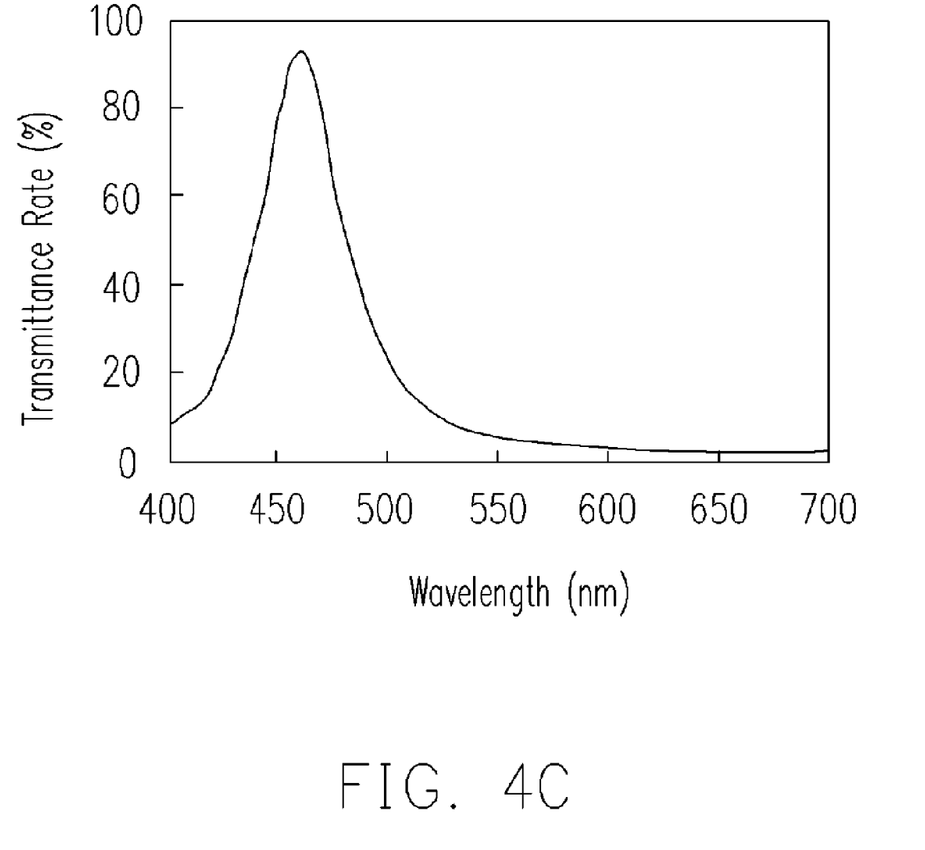

FIGS. 4A~4C are diagrams showing relationships of transmittance and wavelength when white light emits into three protecting films. As shown in FIG. 4A, when white light emits into the protecting film 232, the transmittance of red light (wavelength in a range of about 550~700 nm) is relatively high so that red light is truly filtered by the protecting film 232.

Similarly, as shown in FIG. 4B, when white light emits into the protecting film 234, the transmittance of green light (wavelength in a range of about 450~600 nm) is relatively high so that green light is truly filtered by the protecting film 234. As shown in FIG. 4C, when white light emits into the protecting film 236, the transmittance of blue light (wavelength in a range of about 400~550 nm) is relatively high so that blue light is truly filtered by the protecting film 236.

Figure 5A:
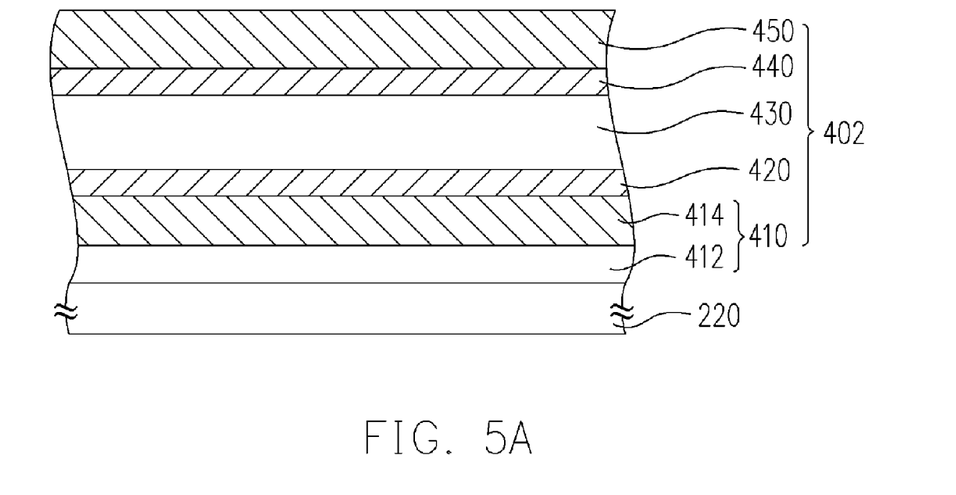
FIG. 5A and FIG. 5B are cross-section views showing the protecting films according to another embodiment of the present invention.
Figure 5B:
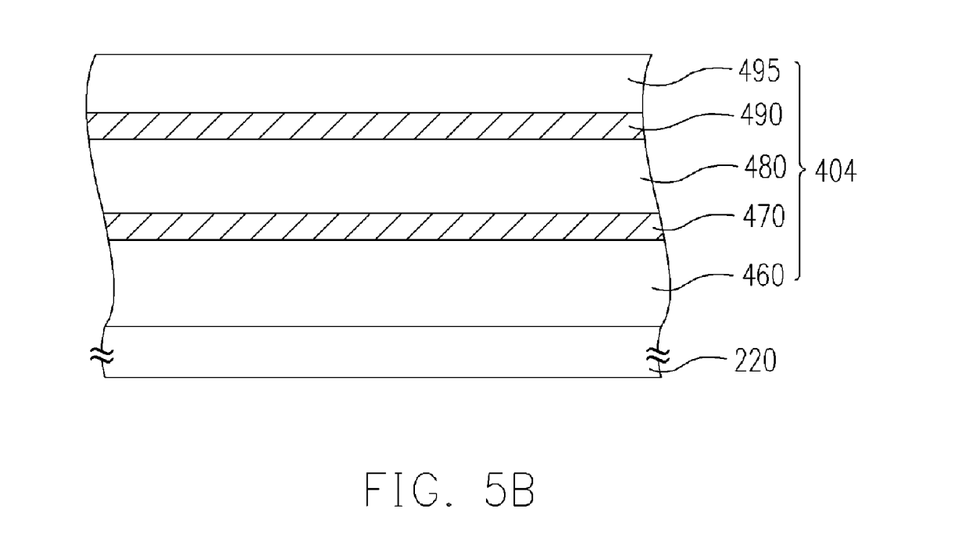

In another embodiment, the protecting films are constituted of stacked layers of FIG. 5A and FIG. 5B that comprising two metal layers and several dielectric layers.

As shown in FIG. 5A, the protecting film 232 of FIG. 2 for filtering light 242 is composed of at least one stacked layer 402, each stacked layer 402 includes the following films stacked sequentially: a dielectric layer 410, a metal layer 420, a low refractive dielectric layer 430, another metal layer 440 and a high refractive dielectric layer 450.

In an embodiment, the dielectric layer 410 comprises at least one low refractive dielectric layer 412 and at least one high refractive dielectric layer 414. The low refractive dielectric layer 412 comprises silicon oxide, and the high refractive dielectric layer 414 comprises titanium dioxide. The metal layers 420, 440 comprises silver. The low refractive dielectric layer 430 comprises silicon oxide, and the high refractive dielectric layer 450 comprises titanium dioxide. Hence, the stacked layer 402 of FIG. 5A has the two metal layers 420, 440 and of the dielectric layers 410, 430, 450.

Additionally, as shown in FIG. 5B, the protecting films 234, 236 of FIG. 2 for filtering light 244, 246 are respectively composed of at least one stacked layer 404, each stacked layer 404 includes the following films stacked sequentially: a low refractive dielectric layer 460 over the white light electro-luminescence devices 220, a metal layer 470 on the low refractive dielectric layer 460, another low refractive dielectric layer 480 on the metal layer 470, another metal layer 490 on the low refractive dielectric layer 480 and another low reflective dielectric layer 495 on the metal layer 490. The metal layers 470, 490 comprises silver. The three low refractive dielectric layers 460, 480, 495 comprise silicon oxide. Therefore, the stacked layer 404 of FIG. 5B has two metal layers 470, 490 and three low refractive dielectric layers 460, 480, 495.

Since the stacked layers 402, 404 of the protecting films 232, 234, 236 have different thickness and composition, white light can be filtered as different color. For example, if the protecting film 232 is constituted of the stacked layer 402 of FIG. 5A while the protecting films 234, 236 are constituted of the stacked layer 404 of FIG. 5B, and the protecting film 234 is thicker than the protecting film 236, the protecting film 232 is used for filtering red light, the protecting film 234 is used for filtering green light and the protecting film 236 is used for filtering blue light.

Figure 6A:
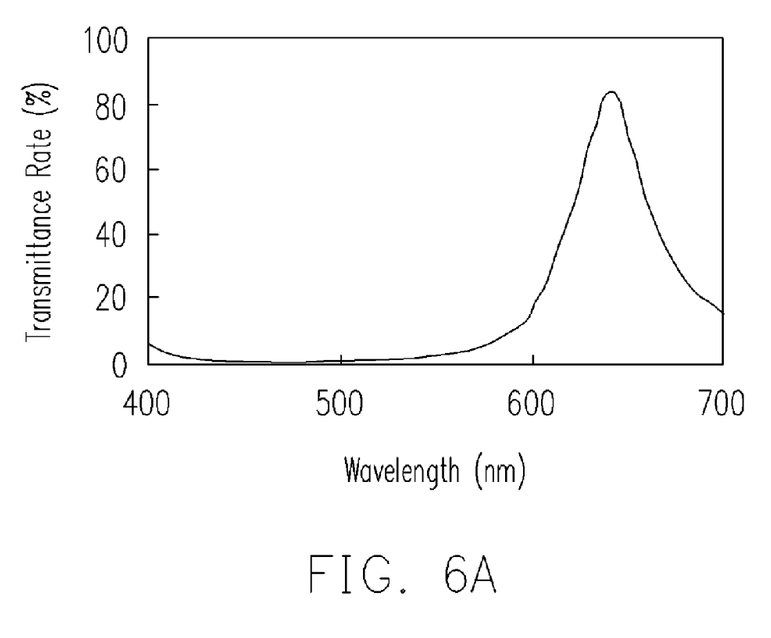
FIGS. 6A~6C are diagrams showing relationships of transmittance and wavelength when white light emits into another three protecting films.
Figure 6B:
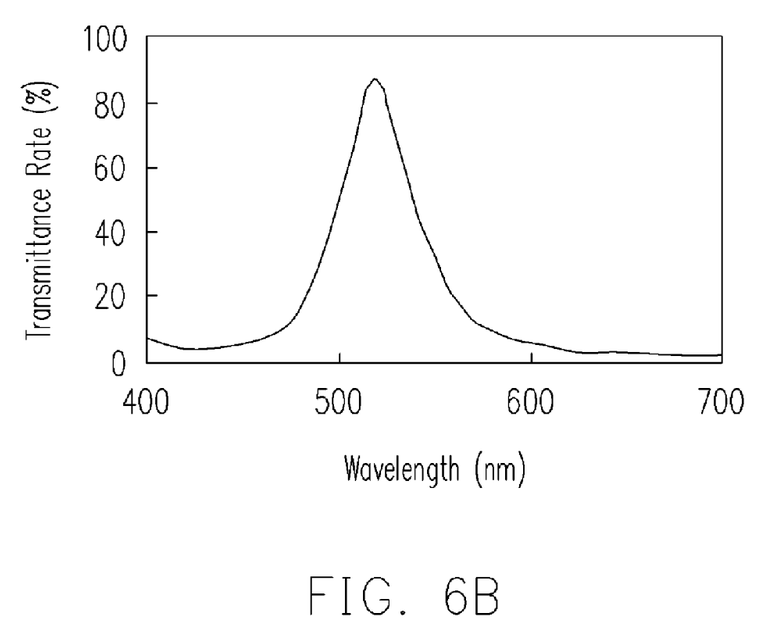
Figure 6C:
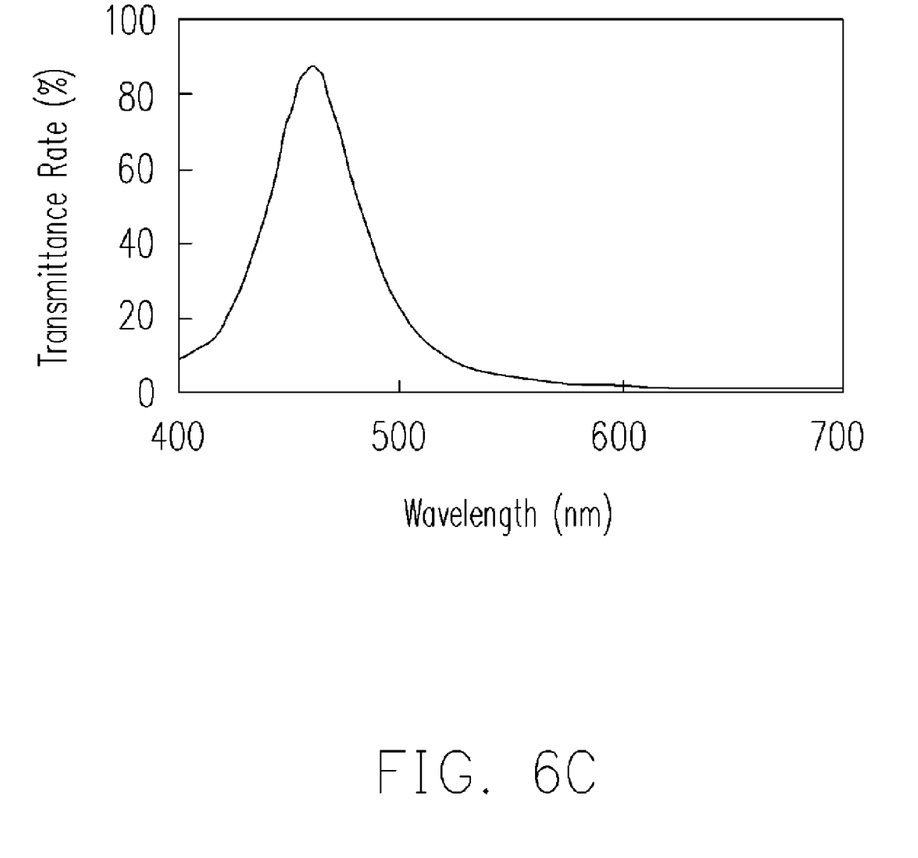

FIGS. 6A~6C are diagrams showing relationships of transmittance and wavelength when white light emits into another three protecting films. As shown in FIG. 6A, when white light emits into the stacked layer 402, the transmittance of red light (wavelength in a range of about 550~700 nm) is relatively high so that red light is truly filtered by the stacked layer 402 of the protecting film 232.

Similarly, as shown in FIG. 6B, when white light emits into the stacked layer 404, the transmittance of green light (wavelength in a range of about 450~600 nm) is relatively high so that green light is truly filtered by the stacked layer 404 of the protecting film 234. As shown in FIG. 6C, when white light emits into the stacked layer 404, the transmittance of blue light (wavelength in a range of about 400~550 nm) is relatively high so that blue light is truly filtered by the stacked layer 404 of the protecting film 236.

It should be noted that each stacked layer is a dense film of multi-layer and the adhesion between the substrate and the stacked layer and the adhesion between the films of the multi-layer are high so that the protecting films do not easily peel off. Besides, the dense stacked layer has good resistance to moisture and oxygen so that the white light organic electro-luminescence devices can be protected completely.

For the foregoing, the organic electro-luminescence display of the present invention has advantages as follows.

First, the protecting films of the organic electro-luminescence display have functions of filtering color and resisting moisture and oxygen. In other words, the protecting films not only protect the devices from damage of moisture and oxygen but also filter white light as different color.

Second, the filtered light has optimum brightness when the light transmits out of each protecting film.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic electro-luminescence display, comprising:
 a substrate;
 a plurality of white light organic electro-luminescence devices disposed on the substrate;
 a first protecting film covering a portion of the white light organic electro-luminescence devices, and the first protecting film has a property of filtering first-color light;
 a second protecting film covering another portion of the white light organic electro-luminescence devices, and the second protecting film has a property of filtering second-color light; and
 a third protecting film covering the other white light organic electro-luminescence devices, and the third protecting film has a property of filtering third-color light,
 wherein the first, second and third protecting films cover the top surface and the side surfaces of each white light organic electro-luminescence device
 wherein the first protecting film is thicker than the second protecting film, the second protecting film is thicker than the third protecting film, and the first, second and third protecting films are respectively constituted of at least one stacked layer, the stacked layer includes:
 a first dielectric layer over the white light organic electro-luminescence devices;
 a second dielectric layer over the first dielectric layer; and
 a metal layer between the first and second dielectric layers.

2. The organic electro-luminescence display according to claim 1, wherein the first-color light is red light, the second-color light is green light and the third-color light is blue light.

3. The organic electro-luminescence display according to claim 1, wherein the metal layer has a material of silver.

4. The organic electro-luminescence display according to claim 1, wherein the first dielectric layer is constituted of at least one high refractive dielectric layer and at least one low refractive dielectric layer.

5. The organic electro-luminescence display according to claim 4, wherein the high refractive dielectric layer comprises silicon nitride or titanium dioxide.

6. The organic electro-luminescence display according to claim 4, wherein the low refractive dielectric layer comprises silicon oxide.

7. The organic electro-luminescence display according to claim 1, wherein the second dielectric layer is constituted of at least one high refractive dielectric layer and at least one low refractive dielectric layer.

8. The organic electro-luminescence display according to claim 7, wherein the high refractive dielectric layer comprises silicon nitride or titanium dioxide.

9. The organic electro-luminescence display according to claim 7, wherein the low refractive dielectric layer comprises silicon oxide.

10. An organic electro-luminescence display, comprising:
a substrate;
a plurality of white light organic electro-luminescence devices disposed on the substrate;
a first protecting film covering a portion of the white light organic electro-luminescence devices, and the first protecting film has a property of filtering first-color light;
a second protecting film covering another portion of the white light organic electro-luminescence devices, and the second protecting film has a property of filtering second-color light; and
a third protecting film covering the other white light organic electro-luminescence devices, and the third protecting film has a property of filtering third-color light,
wherein the first, second and third protecting films cover the top surface and the side surfaces of each white light organic electro-luminescence device,
wherein the first protecting film is constituted of at least one first stacked layer, the first stacked layer comprises the following films sequentially stacked:
a first dielectric layer over the white light organic electro-luminescence devices;
a first metal layer on the first dielectric layer;
a low refractive dielectric layer on the first metal layer;
a second metal layer on the low refractive dielectric layer; and
a high refractive dielectric layer on the second metal layer,
the second and third protecting films are respectively constituted of at least one second stacked layer, wherein the second protecting film is thicker than the third protecting film, and the second stacked layer includes the following films sequentially stacked:
a first low refractive dielectric layer over the white light organic electro-luminescence devices;
a third metal layer on the first low refractive dielectric layer;
a second low refractive dielectric layer on the third metal layer;
a fourth metal layer on the second low refractive dielectric layer; and
a third low refractive dielectric layer on the fourth metal layer.

11. The organic electro-luminescence display according to claim 10, wherein the first, second, third and fourth metal layers have a material of silver.

12. The organic electro-luminescence display according to claim 10, wherein the first dielectric layer is constituted of at least one high refractive dielectric material and at least one low refractive dielectric material.

13. The organic electro-luminescence display according to claim 12, wherein the high refractive dielectric material comprises titanium dioxide.

14. The organic electro-luminescence display according to claim 12, wherein the low refractive dielectric material comprises silicon oxide.

15. The organic electro-luminescence display according to claim 10, wherein the low refractive dielectric layer, the first, second and third low refractive dielectric layer have a material comprising silicon oxide.

16. The organic electro-luminescence display according to claim 10, wherein the high refractive dielectric layer comprises titanium dioxide.

* * * * *